(12) United States Patent
Pavithran et al.

(10) Patent No.: US 7,791,357 B2
(45) Date of Patent: Sep. 7, 2010

(54) ON SILICON INTERCONNECT CAPACITANCE EXTRACTION

(75) Inventors: Praveen Pavithran, Nijmegen (NL); Marcel Pelgrom, Helmond (NL); Jean Wieling, Nijmegen (NL); Hendricus Joseph Veendrick, Heeze (NL)

(73) Assignee: NXP B.V., Eindhoven (NL)

( * ) Notice: Subject to any disclaimer, the term of this patent is extended or adjusted under 35 U.S.C. 154(b) by 252 days.

(21) Appl. No.: 11/722,629

(22) PCT Filed: Dec. 19, 2005

(86) PCT No.: PCT/IB2005/054320

§ 371 (c)(1),
(2), (4) Date: Feb. 28, 2008

(87) PCT Pub. No.: WO2006/067733

PCT Pub. Date: Jun. 29, 2006

(65) Prior Publication Data

US 2008/0143348 A1    Jun. 19, 2008

(30) Foreign Application Priority Data

Dec. 23, 2004  (EP) .................................. 04106917

(51) Int. Cl.
*G01R 27/26* (2006.01)
(52) U.S. Cl. ..................... 324/681; 324/711; 324/763; 716/6
(58) Field of Classification Search .................. 324/681
See application file for complete search history.

(56) References Cited

U.S. PATENT DOCUMENTS 3,187,195 A   6/1965   Stefanov (Continued)

OTHER PUBLICATIONS

Chen, J. C; et al "An On-Chip, Interconnect Capacitance Characterization Method With Sub-Femto-Farad Resolution" Microelectronic Test Structures, 1997. ICMTS 1997. Proceedings. IEEE Conference, Mar. 17, 1997, pp. 77-80.

*Primary Examiner*—Timothy J Dole
*Assistant Examiner*—Benjamin M Baldridge

(57) ABSTRACT

The present invention relates to a on-chip circuit for on silicon interconnect capacitance (Cx) extraction that is self compensated for process variations in the integrated transistors. The circuit (10) comprises signal generation means (20) for generating a periodical pulse signal connected to first and to second signal delaying means (31, 32) for respective delaying said pulse signal, wherein said second signal delaying means (32) are configured to have a delay affected by said interconnect capacitance (Cx); a logical XOR gate (35) for connecting respective first and said second delay signals of said respective first and second delay means (31, 32), said logical XOR gate (35) being connected to signal integrating means (40); and said signal integrating means (40) being connected to analog to digital converting means (50). Whilst the error in conventional uncompensated systems, like delay line only, the error can be up to 30%, in the circuit according to the invention, the error due to process variations in the front-end is about 2%. Further, an output is provided in a digital format and thus, can be measured quickly with simple external hardware. Furthermore, the pulse signal frequency can be used as a monitor to measure process variations in the front-end. Moreover, since the circuit (10) is remarkably accurate and very easy to measure, it is the best choice as a process monitor for every chip fabricated in the future.

14 Claims, 4 Drawing Sheets

U.S. PATENT DOCUMENTS

| | | | |
|---|---|---|---|
| 5,875,114 A * | 2/1999 | Kagatani et al. ............... 716/6 |
| 5,963,043 A * | 10/1999 | Nassif ........................ 324/681 |
| 6,208,172 B1 | 3/2001 | Evoy et al. |
| 2001/0048384 A1 * | 12/2001 | Noro ........................... 341/164 |
| 2002/0044053 A1 | 4/2002 | Seki |
| 2003/0001185 A1 | 1/2003 | Sell et al. |
| 2003/0052700 A1 * | 3/2003 | Marshall et al. .............. 324/711 |
| 2004/0222811 A1 * | 11/2004 | Szczypinski et al. ......... 324/763 |
| 2004/0257133 A1 * | 12/2004 | Ishikawa ..................... 327/172 |

* cited by examiner

ON SILICON INTERCONNECT CAPACITANCE EXTRACTION

The present invention relates to a circuit, a method, and a semiconductor chip.

As process technologies steadily shrink and design sizes increase, new interconnect verification tools are needed that provide appropriate level of accuracy. Basically, interconnect verification is achieved through the combination of extraction and analysis tools. An extraction tool provides RC values for the interconnects that are used in turn by an analysis tool. Thus, the quality of the analysis is dependent on the quality of the extraction. In general, key factors for evaluating interconnect extraction tools are capacity, accuracy, and speed. Accordingly, in deep submicron (DSM) and ultra-deep submicron (UDSM) very large scale integration (VLSI) circuits there is an increasing need to measure locally, most suitable on-chip, the important variables of technology. If technology variables can be measured quickly and efficiently, it improves quality control of chips, provides better estimation of silicon speed, helps control operating parameters like voltage and frequency for optimum speed and power dissipation.

The transistors are the front-end and interconnect the back-end. Many different methods have been previously employed for measuring on-chip capacitance. These methods include ring oscillators (ringos), bridges, matched transistors, RC time measurements, etc. These procedures are either inaccurate or need dedicated external hardware to measure. If the on-chip capacitance could be measured easily, it would help the engineers in quality control of chips estimating speed and diagnosing processing failures.

The best way for interconnect extraction is silicon itself. Hence, test structures fabricated on a silicon wafer in the target technology, can be used to characterize certain functions, to qualify processes as well as to validate and refine extraction models. Such an active approach, for instance, uses an on-chip sensor circuit to enable measurement of current, from which, for instance, a wire capacitance can be derived. An active test-chip approach for measuring a MOSFET capacitance is, for example, well documented in Narain Arora, "MOSFET Modeling for VLSI Circuit Simulation: Theory and Practice.", Springer-Verlag NY 1993. This technique was first applied to the measurement of interconnect capacitance by P. Nouet and A. Khalkhal, from Universitie Montpellier, France, in 1995. A simplified concept is disclosed in J. C. Chen, B. McGaughy, D. Sylvester, and C. Hu, "An On-Chip Atto Farad (aF) Interconnect Charge-Based Capacitance Measurement Technique," IEEE Tech. Digest International Electron Devices Meeting, in press, 1996.

FIG. 1 shows a known active approach consisting of NMOS and PMOS transistors configured to function like an inverter. The configurations of the two inverters are identical except that one includes the unknown interconnect capacitance to be measured. Vp and Vn signals, shown in FIG. 1, are non-overlapping signals to ensure that only one of each transistor in the inverters is conducting at the same time. The signals Vp and Vn are generated from an external dual-pulse generator that controls pulse-width independently. The signals Vn and Vp are applied to the gates of the inverters. The unknown capacitance C, in FIG. 1 can be derived by measuring the difference in the average drain currents of the two inverters from the following equation:

$$\bar{i}_1 - \bar{i}_2 = f \cdot \int_0^{V_{DD}} C\, dv = C \cdot V_{DD} \cdot f \Rightarrow C = \frac{\bar{i}_1 - \bar{i}_2}{V_{dd} \cdot f},$$

in which f is the frequency of the signals Vp and Vn, $V_{DD}$ is the supplied voltage, and $\bar{i}_1$ and $\bar{i}_2$ are the respective average drain currents of the inverters.

However, this approach has several drawbacks. Each of the drain currents, which are normally in the pA to nA range, have to be measured by a respective current meter. Further, the accuracy of the frequency of the test signals Vp and Vn and the supply voltage $V_{DD}$ have influence on the derived capacitance value. Further, a frequency stable dual pulse generator, two reliable current meters and a low-noise DC power supply within microvolt range are needed.

It is an objective of the present invention to provide a circuit and method for on-chip capacitance extraction with minimum external hardware requirements. It is a further object of the invention to provide a circuit for on-chip capacitance extraction which provides a high accuracy, desirably by self-compensating for process variations in the used semiconductor devices. It is yet another objective of the present invention to provide a circuit for on-chip capacitance extraction which delivers an output signal which is easily to measure. It is yet a further object of the invention to provide a circuit and method in which deviations of a test signal's frequency can be utilized as additional information on process parameters.

All or particular objectives of the invention are solved by a circuit as follows: Said circuit chip for interconnect capacitance measurement is integrated on a semiconductor and comprises: signal generation means for generating a periodical pulse signal, said pulse signal is connected to first and to second signal delaying means for respective delaying said pulse signal, said first and second delay means are identical in every respect except that said second signal delaying means are configured to have a delay affected by said interconnect capacitance, there is further a logical XOR gate means for connecting respective first and said second delay signals of said respective first and second delay means, said logical XOR gate means is connected to signal integrating means, said signal integrating means are connected to analog to digital converting means.

All or particular objectives of the invention are solved by a method as follows: Said method for interconnect capacitance extraction and measurement of process variations, comprises the steps: generating a periodical pulse signal; delaying said pulse signal by a first and by a second delay means, wherein a delay of said second delay means is affected by said capacitance; logical combining said respective first delayed pulse signal and said second delayed pulse signal by a logical XOR function for deriving a differential pulse signal; integrating said differential pulse signal; and converting said integrated differential pulse signal into a digital output signal. Said method may further comprise a step of counting a pulse frequency of said pulse signal of said generating step.

In a first embodiment of the invention, said signal generation means is a ring oscillator comprising at least a logical NAND gate and a feed-back loop made of a first even number of consecutive connected logical gate elements. It goes without saying that for the set-up of the ringo the use of another logical gate means instead of the logical NAND gate is possible, e.g. a logical NOR gate. Further, each of said first and second delay means comprise a second even number of consecutive connected logical gate elements, said logical gate elements of said second delay means being loaded at respective outputs with said capacitance. Basically, any kind of logical gate elements can be used for set-up said ring oscillator and said first and second delay means. Preferably, each of said logical gate elements is a logical inverter gate. The circuit setup according this embodiment of the invention has the advantage to be self compensated for the process variations in the transistors.

In a second embodiment of the invention, said circuit further comprises frequency counting means connected to said periodical pulse signal generated by said signal generation means. Advantageously, said frequency delivered by said frequency counting means, e.g. a digital counter circuit, can be used as a monitor to measure process variations in the front-end by analysing deviations of said frequency.

In a further development of the first and second embodiment, each of said first and second delay means further comprise an additional logical gate element interconnected between said respective delay means and said logical XOR gate means. Advantageously, a slew rate of the signals input to said logical XOR gate means are made similar.

Since said circuit is remarkably accurate and very easy to measure, it is applicable as a process monitor for any kind of fabricated semiconductor chip. Thus, said circuit according to the invention can advantageously be integrated on a semiconductor chip besides other integrated circuitry. Further, said circuit provides an output in digital format, which can be measured quickly with simple external hardware and which is accurate.

Said circuit according to the invention can advantageously be used as a semiconductor sensor circuit integrated on a semiconductor chip besides other integrated circuitry for monitoring on-chip process variables of semiconductor technology. Accordingly, said method according the invention can advantageously be used by means of a semiconductor sensor circuit integrated on a semiconductor chip besides other integrated circuitry for monitoring on-chip process variables of semiconductor technology. Said circuit and said method can most advantageously be used for monitoring on-chip process variables of semiconductor technology such as an interconnect capacitance or process variations.

The invention will be more completely understood in consideration of the following detailed description of various embodiments of the invention in connection with the accompanying drawings, in which.

Figure 1:
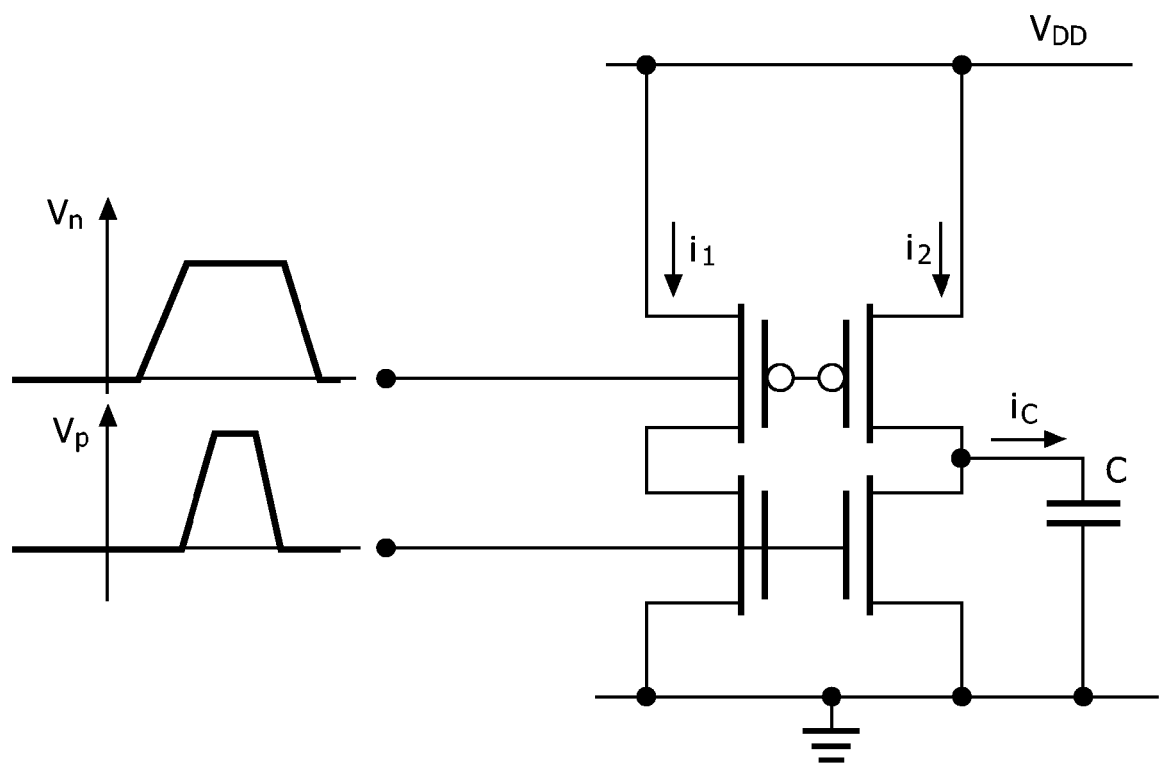
FIG. 1 shows a sensor circuit for measurement of currents, from which a unknown capacitance C can be derived, according to the prior art.

While the invention is amendable to various modifications and alternative forms, a specific thereof will be shown by way of example in the drawings and will be described in detail. However, it should be understood that the intention is not to limit the invention to the particular embodiment described. On the contrary, the intention is to cover all modifications, equivalents, and alternatives falling within the scope of the invention as defined by the appended claims.

Figure 2:
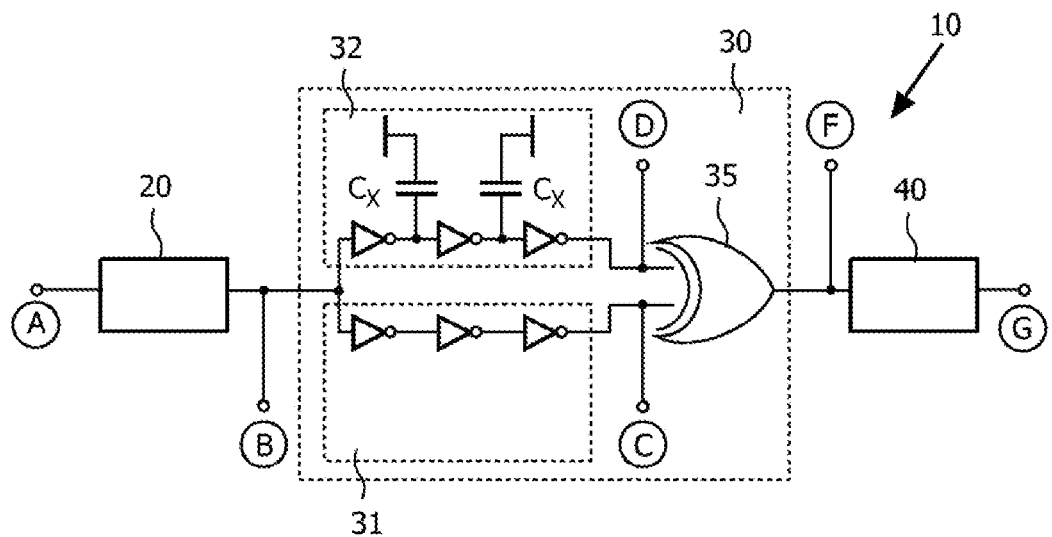
FIG. 2 shows a block diagram of the circuit for on silicon interconnect capacitance extraction (OSICX) according to the invention.

Now reference is made to FIG. 2 showing a block diagram of the circuit 10 for on silicon interconnect capacitance extraction (OSICX) according to the invention. There are signal generation means 20 for generating a periodical pulse signal. The signal generation means 20 has a control input, node A. A logical high signal at node A enables the signal generation means 20 and at the output, node B, the generated pulse signal is output. The pulse signal is connected to a differential block 30 that comprises first signal delaying means 31 and second signal delaying means 32 for respective delaying the pulse signal. The first and second delay means 31, 32 are identical in every respect except that the second signal delaying means 32 are configured to have a delay affected by the (unknown) interconnect capacitances $C_x$. There is a logical XOR gate 35 for connecting the respective first and second delay signals of the respective first and second delay means 31, 32. The first and second delay signals are present at respective nodes C and D of the circuit 10. The logical XOR gate 35 is connected to signal integrating means 40, which transform the pulse signal output by the XOR gate 35 into a output signal at node G having a substantially constant level.

Figure 3:
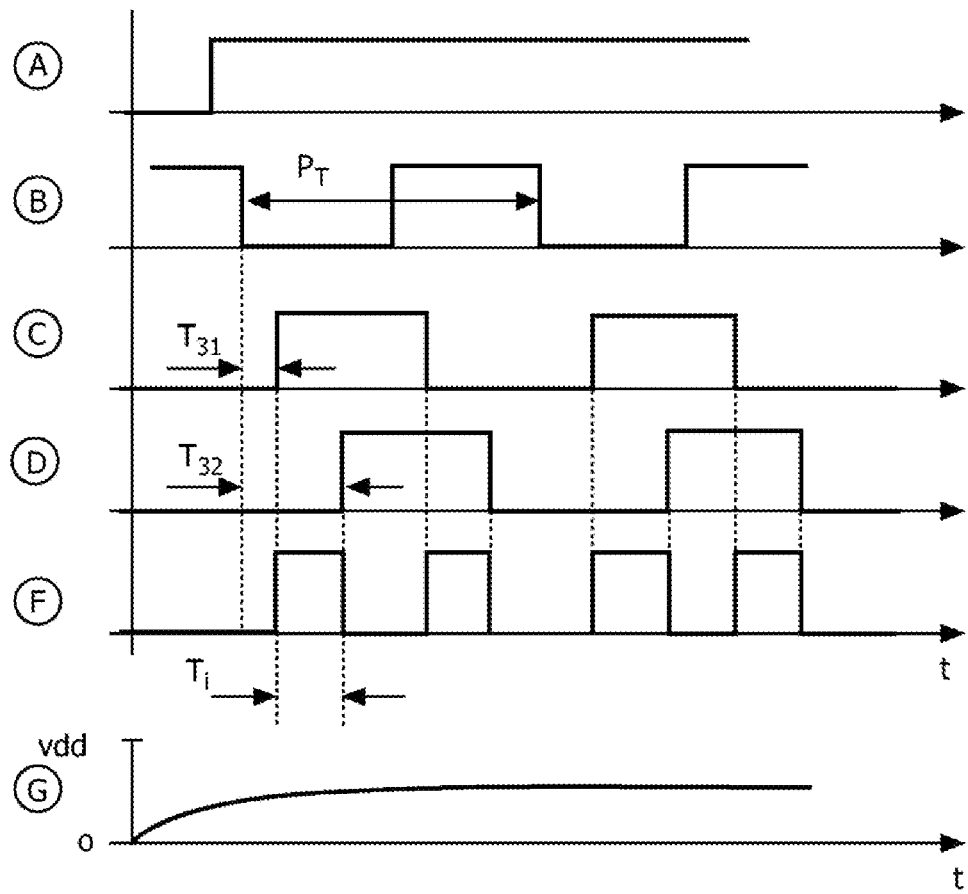
FIG. 3 shows waveforms at important nodes of the OSICX circuit of FIG. 2.

The setup of the circuit 10 in FIG. 2, measures the capacitance $C_X$ accurately because the proposed procedure reduces advantageously process variations in the transistors, which are used in the elements of the circuit 10. The reason will become apparent from the description below. The signal processing of the circuit 10 can be followed from FIG. 3, in which waveforms of signals present in the circuit 10 are shown at important nodes (depicted with letters A, B, C, D, F and G). The signal at node A represents the level of a control signal for enabling and disabling the signal generation means 20. At node B the waveform of the generated pulse signal is depicted, which has a period length $P_T$. It is to be noted that it does not matter for the function of the circuit 10 whether the pulse signal is high active or low active. The signal at node C corresponds to the generated pulse signal after passing the first delay means 31 and thus being delayed by a delay time $T_{31}$. The signal at node D corresponds to the generated pulse signal after passing the second delay means 32 and being been delayed by a total delay time $T_{32}$. Since the first and second delay means 31, 32 are identical in every respect except that the second signal delaying means 32 are configured such that the delay is further affected by the (unknown) interconnect capacitances $C_x$, the interval $T_i$ corresponds to the additional transit time, i.e. delay time caused by the interconnect capacitances $C_x$. At node F a differential pulse signal is shown as result of the logical XOR connection of the first delay signal present at node C and the second delay signal present at node D. Firstly, the differential pulse signal has twice the frequency of the pulse signal at node B. Secondly, the duty time of the differential pulse signal corresponds to the time interval $T_i$, which is the difference of $T_{32}$-$T_{31}$. Since Ti is caused by the capacitance $C_x$, the pulses of the differential pulse signal carry information about the unknown capacitance $C_x$. In other words, the differential pulse signal comprises pulses a duration of which corresponds to the difference between the delay time $T_{32}$ of the second delayed signal and the delay time $T_{31}$ of the first delay signal. Therefore, the intermediate pulse signal is a differential pulse signal output of the differential block 30. At node G, after a short build-up time after enabling the signal generation means 20, an output signal having a substantial constant level is provided, which corresponds to the value of the unknown interconnect capacitance $C_x$.

Now reference is made to FIG. 4 by which a preferred embodiment of the present invention will be described. For the sake of brevity only differences to the circuit 10 in FIG. 2 will be discussed. The circuit 11 of FIG. 4 has additional to the circuit 10 in FIG. 2 a frequency counter 28 and analog to digital (A/D)-converter 50. The frequency counter 28 is connected to the signal at node B of the circuit 11. Thus, the pulse signal frequency can be used as a monitor to measure process variations in the front-end which are reflected by deviations of the pulse signal frequency. The A/D-converter 50 converts the analog output signal at node G into output signal having a digital format. Hence, the pulse signal frequency and the output signal corresponding to the capacitance $C_x$ are present in digital format which can easily be read out by means of minimum external hardware. Further in FIG. 4, a minimum example for the integrating means 40 is shown, which is a low pass filter consisting of a series resistor $R_{TP}$ and a parallel capacitance $C_{TP}$. The resistance $R_{TP}$ can be made with polysilicon and a MOS gate can be used to make the capacitor $C_{TP}$. The frequency counter is a digital circuit that will measure the frequency of the pulse signal generation means 20. Furthermore, there is a first ground line 61 depicted which enhances signal quality by isolating the signal generation part and thus, reducing noise.

Figure 4:
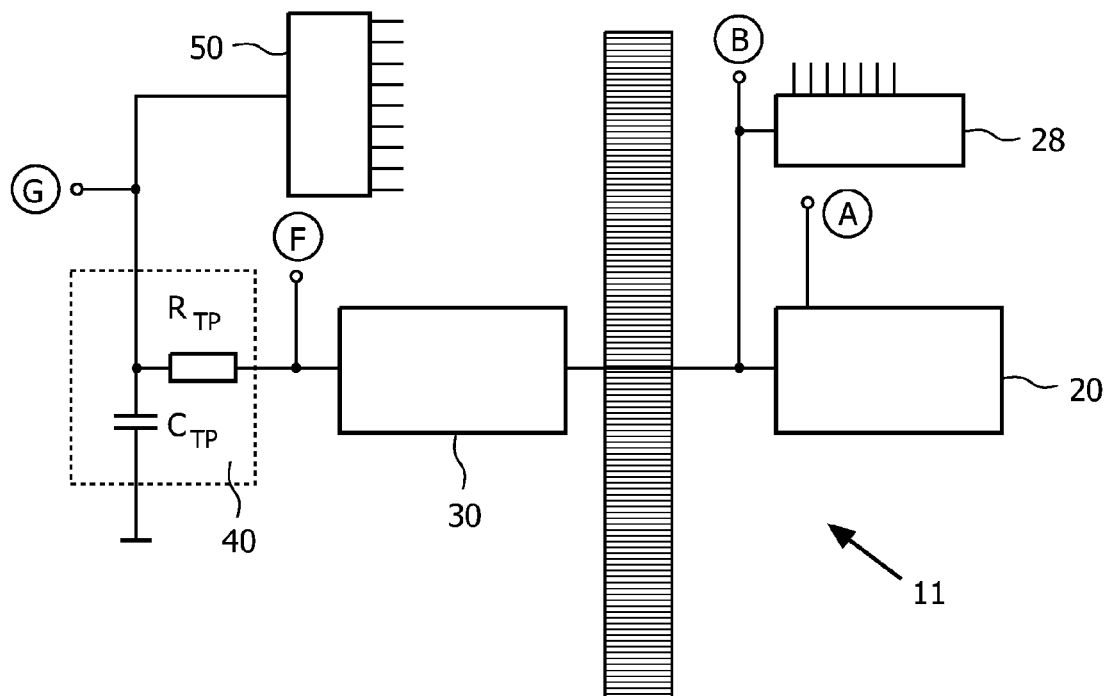
FIG. 4 shows a block diagram of the OSICX circuit according to a preferred embodiment of the invention.
Figure 5:
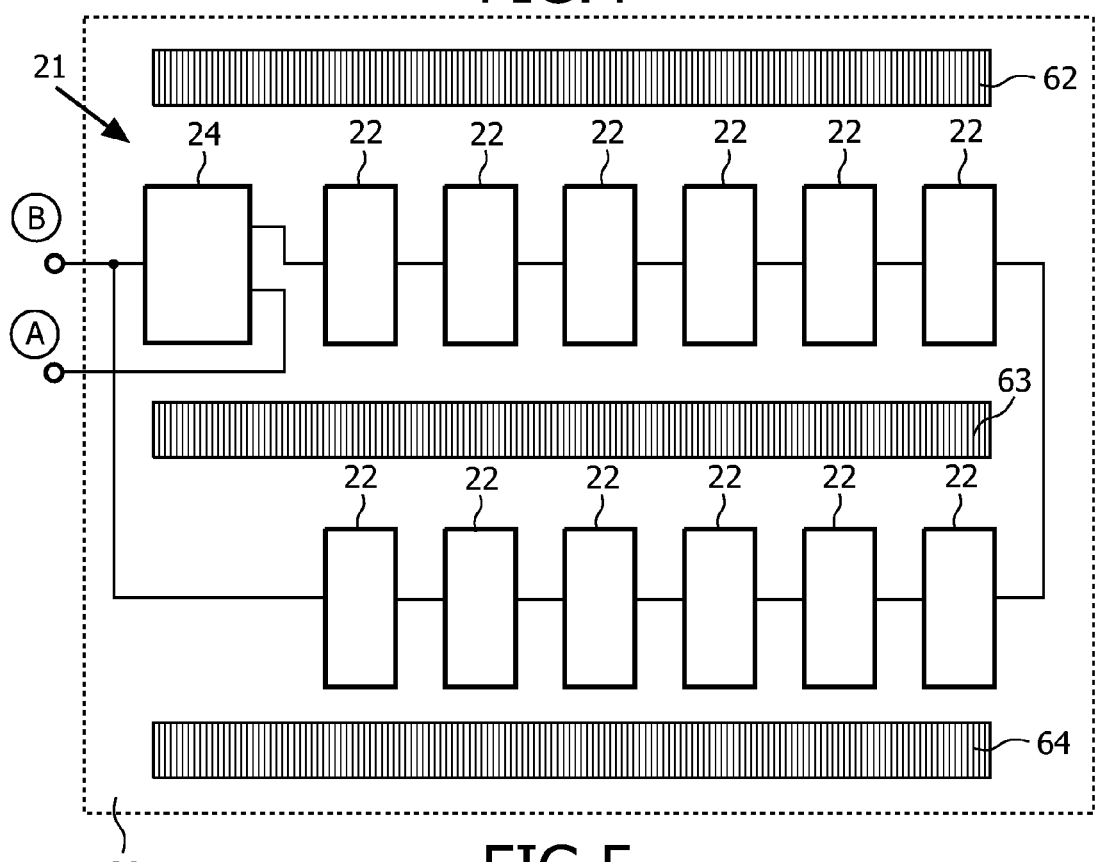
FIG. 5 shows a oscillator circuit used in the OSICX circuit of FIG. 4.

In FIG. 5, the construction of the signal generation means 20 of the preferred embodiment of FIG. 4 are shown. A ring oscillator 21 for pulse signal generation is made with a feedback loop comprising 12 inverters 22 and one 2-input NAND gate 24. If a control signal at the control node A is set to '0' then the ring oscillator 21 is off, i.e. disabled, if the control signal at the control node A is set to "1" then the ring oscillator 21 is on, i.e. enabled. Once again, ground lines 62, 63, 64 are added to isolate the each segment and reduce noise. When the feedback loop is complete, the ring oscillator 21 oscillates with a frequency at $f_{osc}=1/P_T$, which is substantially proportional to the product of resistance R and capacitance $C_t$ of the used transistors according to the following equation (1):

$$f_{osc} = \frac{1}{kRC_t} \quad (1)$$

In equation (1), k is a constant of proportionality, R is the transistor resistance, which is the sum of the resistances of the p- and n-transistors used in the inverters 22 of the ring oscillator 21, and $C_t$ is the transistor capacitance. The effective transistor resistance can be estimated as the average of the p- and n-transistors:

$$R = \frac{R_n + R_p}{2} \quad (2)$$

The generated pulse signal having the frequency $f_{osc}$ is then fed into the differential block 30 (FIGS. 2, 4). As can be seen in the waveforms in FIG. 3, the pulse of the delay line loaded with the unknown capacitance $C_x$ will be delayed as compared to the unloaded delay line. This delay is due to the extra capacitances $C_x$. This additional delay is transformed into a pulse signal by the logical function of XOR gate 35. The width of this pulse $T_i$ is proportional to the interconnect capacitance $C_x$ and effective transistor resistance R:

$$T_i = mRC \quad (3),$$

in which m is a constant.

Figure 6:
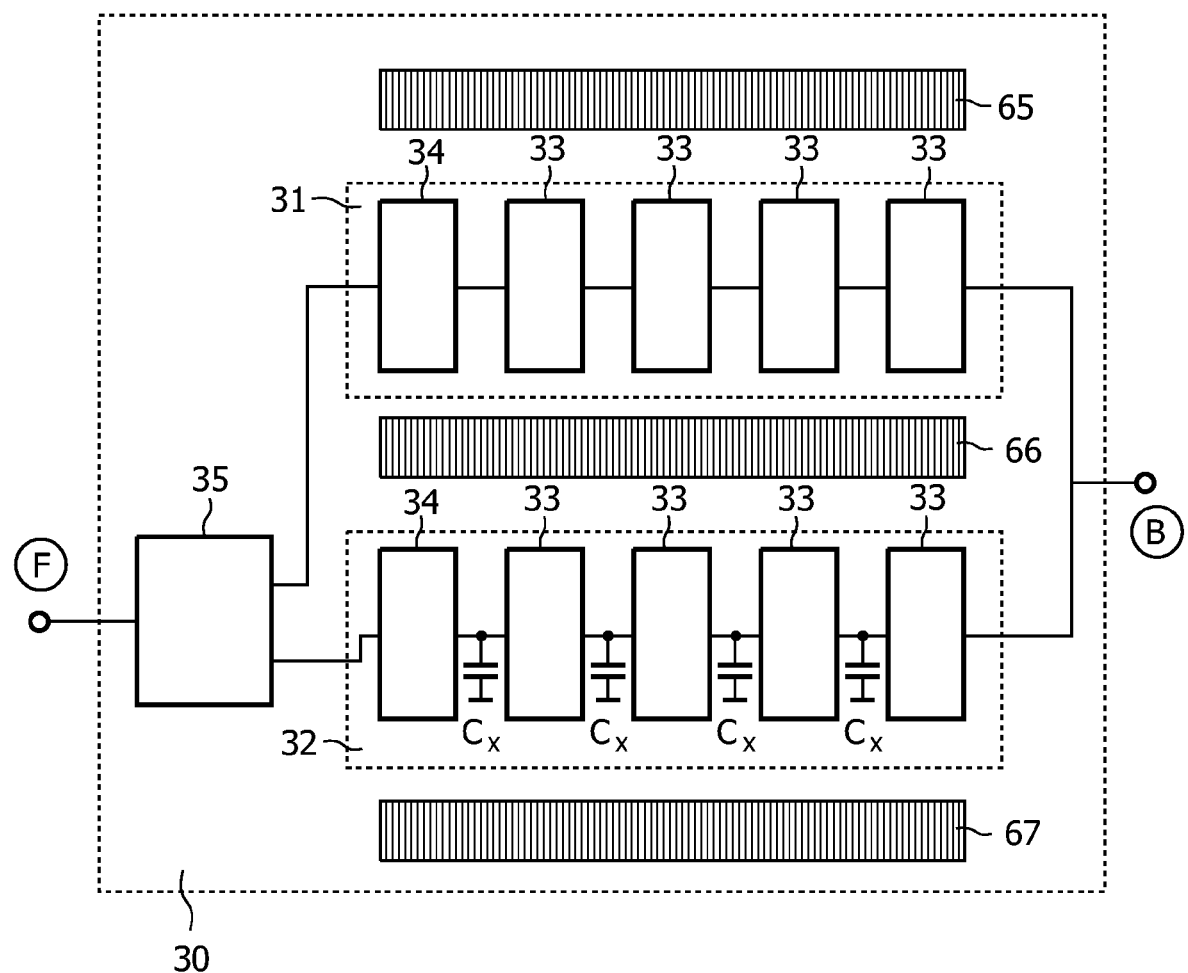
FIG. 6 shows a delay line circuit used in the OSICX circuit of FIG. 4.

FIG. 6 shows an implementation of the differential block 30 in FIG. 4 of the preferred embodiment with the respective delay lines 31, 32. The delay lines 31, 32 in FIG. 6 are arranged in two rows. It is to be noted that in the preferred embodiment a delay line 31, 32 consists of four inverters 33 and an extra inverter 34. On the second delay line 32 four inverters are loaded with the same capacitance $C_x$ that needs to be measured. Since an even number of the same inverters 33 are chosen equation (2) is satisfied. Further, the inverters 22 used in the ring oscillator and the inverters 33, 34 used in the delay lines 31, 32 of the differential block 30 are the same. The extra inverter is added on both delay lines 31, 32 so that the slew rates at the inputs of the XOR gate 35 are similar. Once again, ground lines 65, 66, 67 are added to isolate the delay lines 31, 35 and reduce noise. By this implementation the requirements of accuracy and area are satisfied.

In the preferred embodiment, the inverters 22 with even number in the ring oscillator 21 and the inverters 33 with even number in the delay lines 31, 32 are identical, thus the resistance R in equation (1) and equation (3) is the same. As mentioned-above, the pulse signal at the input node F of the low pass filter 40 has twice the frequency given by equation (1) and a duty cycle given by equation (3). The low pass filter 40 converts this pulse signal to a DC voltage $V_{out}$ that is the ratio of the duty cycle to the period of the pulse. So from equation (1) and equation (3) follows:

$$V = \frac{T_i}{T_{osc}} = \frac{mRC_x}{kRC_t} = k_1 \frac{C_x}{C_t} \quad (4)$$

As can be seen from equation (4), advantageously the transistor resistance R does not affect the result. The transistor capacitance $C_t$ being largely the gate capacitance is a very stable parameter, since oxide growth is the most critical and well characterized step in fabrication. The process sensitive transistor resistance term, however, i.e. the transistor resistance R, is eliminated.

Conventionally used on-silicon measurements that do not account for the variations in the transistor (front-end) performance can have an error of 30% in the latest CMOS technologies. In the circuit according to the present invention, the ring oscillator accounts for the transistor performance variation and compensates it. According to experiments, the front-end induced error is about 1-2% in this procedure. This method of compensating the variations in the front-end is novel and makes this circuit far superior to uncompensated systems. Advantageously, the analog output voltage $V_{out}$ can be digitized with an A/D converter. Thus, the input signals and output signals are all digital and very easy to measure. Moreover, the control and measurement can be made compatible to the standard testing environment.

The circuit configuration of FIG. 4 provides several advantages. Firstly, the interconnections between gates are small. Secondly, the configuration is symmetric and all cells see the same environment. Thirdly, good matching can be achieved. Fourthly, the ground lines isolate each segment and keep the noise on power lines low. It goes without saying that other implementations of the idea of the invention can use a different number and/or types of logical gates in the delay lines 31, 32 as well as in the ring oscillator 21. Further, the layout configuration may also vary.

Finally but yet importantly, it is noted that the term "comprising" when used in the specification including the claims is intended to specify the presence of stated features, means, steps or components, but does not exclude the presence or addition of one or more other features, means, steps, components or groups thereof. Further, the word "a" or "an" preceding an element in a claim does not exclude the presence of a plurality of such elements. Moreover, any reference sign does not limit the scope of the claims. Furthermore, it is to be noted that "coupled" is to be understood that there is a current path between those elements that are coupled; i.e. "coupled" does not mean that those elements are directly connected.

The invention claimed is:

1. A circuit for interconnect capacitance measurement integrated on a semiconductor chip comprising:
    signal generation means for generating a periodical pulse signal connected to an input of a first signal delaying means and to an input of a second signal delaying means, wherein each of the first and second signal delaying means delays said pulse signal, and wherein said second signal delaying means is configured to have a delay affected by said interconnect capacitance;
    a logical exclusive or (XOR) gate means for receiving the first and second delay signals from the outputs of said first and second delay means, the output of said logical XOR gate means being connected to the input of signal integrating means; and
    the output of said signal integrating means being connected to analog to digital converting means.

2. The circuit according to claim 1 further comprising frequency counting means connected to said signal generation means.

3. The circuit according to claim 1, wherein said signal generation means comprises a logical NAND gate means and a feed-back loop with a first even number of consecutive connected logical gate elements.

4. The circuit according to claim 3, wherein each of said logical gate elements is a logical inverter gate means.

5. The circuit according to claim 1, wherein each of said first and second delay means comprises a second even number of consecutive connected logical gate elements, said logical gate elements of said second delay means being loaded at respective outputs with said capacitance.

6. The circuit according to claim 5, wherein each of said first and second delay means further comprise an additional logical gate element interconnected between said respective delay means and said logical XOR gate means.

7. The circuit according to claim 1, wherein said circuit is integrated on a semiconductor chip containing other integrated circuitry.

8. A semiconductor chip comprising a circuit according to claim 1.

9. The circuit according to claim 1, wherein at least one of said first signal delaying means and said second signal delaying means of said circuit is not a ring oscillator.

10. The circuit according to claim 1, wherein neither said first signal delaying means nor said second signal delaying means of said circuit is a ring oscillator.

11. A method for extraction of interconnect capacitance in a semiconductor chip, comprising the steps of:
    generating a periodic pulse signal;
    delaying said pulse signal by a first and by a second delay means, wherein a delay of said second delay means is affected by said capacitance;
    logically combining said respective first delayed pulse signal and second delayed pulse signal by a logical exclusive or (XOR) function for deriving a differential pulse signal;
    integrating said differential pulse signal; and
    converting said integrated differential pulse signal into a digital output signal.

12. The method according to claim 11, said method further comprising the step of counting a pulse frequency of said pulse signal of said generating step.

13. The method according to claim 11, wherein at least one of said first signal delaying means and said second signal delaying means of said circuit is not a ring oscillator.

14. The method according to claim 11, wherein neither said first signal delaying means nor said second signal delaying means of said circuit is a ring oscillator.

* * * * *